United States Patent
Ireland (10) Patent No.: US 6,923,691 B2
(45) Date of Patent: Aug. 2, 2005

(54) CIRCUIT BOARD STANDOFF

(75) Inventor: John A. Ireland, Jasper (CA)

(73) Assignee: Sanmina-SCI Corporation, Huntsville, AL (US)

( * ) Notice: Subject to any disclaimer, the term of this patent is extended or adjusted under 35 U.S.C. 154(b) by 93 days.

(21) Appl. No.: 10/264,368

(22) Filed: Oct. 4, 2002

(65) Prior Publication Data

US 2004/0218371 A1 Nov. 4, 2004

(51) Int. Cl.$^7$ .............................. H01R 4/02; H05K 7/00
(52) U.S. Cl. ....................................... 439/876; 361/747
(58) Field of Search .............................. 361/728, 732, 361/736, 740, 741, 742, 747, 748, 756, 758, 759, 770, 801, 802; 439/83, 875–876; 174/138 R, 35 R; 211/41.17

(56) References Cited

U.S. PATENT DOCUMENTS

| | | | | |
|---|---|---|---|---|
| 4,318,157 A | * | 3/1982 | Rank et al. | 361/704 |
| 4,373,309 A | * | 2/1983 | Lutz | 52/182 |
| 4,452,359 A | | 6/1984 | Koppensteiner | |
| 4,760,495 A | * | 7/1988 | Till | 361/804 |
| 4,873,394 A | * | 10/1989 | Bhargava et al. | 174/35 R |
| 5,426,265 A | | 6/1995 | Savage, Jr. | |
| 5,445,450 A | | 8/1995 | Hayes et al. | |
| 5,535,100 A | * | 7/1996 | Lubahn et al. | 361/801 |
| 5,607,313 A | * | 3/1997 | Nyman | 439/83 |
| 5,671,124 A | * | 9/1997 | Ho | 361/758 |
| 5,978,232 A | * | 11/1999 | Jo | 361/796 |
| 6,155,433 A | | 12/2000 | Anderson et al. | |
| 6,215,667 B1 | * | 4/2001 | Ady et al. | 361/752 |
| 6,236,574 B1 | * | 5/2001 | Han | 361/816 |
| 6,278,066 B1 | | 8/2001 | Fahlen et al. | |
| 6,333,855 B2 | * | 12/2001 | Prabaonnaud et al. | 361/758 |
| 6,347,042 B1 | * | 2/2002 | White | 361/784 |
| 6,377,445 B1 | * | 4/2002 | Davis et al. | 361/683 |
| 6,456,506 B1 | * | 9/2002 | Lin | 361/816 |
| 6,493,233 B1 | * | 12/2002 | De Lorenzo et al. | 361/752 |
| 6,560,119 B1 | * | 5/2003 | Katsuyama et al. | 361/752 |
| 6,638,120 B2 | * | 10/2003 | Costa | 439/876 |
| 6,842,343 B2 | * | 1/2005 | Lee | 361/747 |

* cited by examiner

*Primary Examiner*—Phuong T. Vu
(74) *Attorney, Agent, or Firm*—Carr & Ferrell LLP (57) ABSTRACT

A circuit board standoff for use with SMT placement machinery is provided comprising a hollow substantially cylindrical member, a flange extending from a bottom section of the cylindrical member and an opening positioned in the top section of the substantially cylindrical member operable to receive a fastener. The circuit board standoff operates to provide physical connection between two circuit boards while maintaining a minimum distance there between for inclusion of any required electronic components.

18 Claims, 9 Drawing Sheets

CIRCUIT BOARD STANDOFF

BACKGROUND OF THE INVENTION

1. Field of the Invention

The present invention relates generally to circuit board mounting devices and, more specifically, to standoff devices used to mount one circuit board to another circuit board.

2. Description of the Related Art

Standoffs are commonly used in the electronics industry to securely hold one circuit board (e.g., a motherboard) to another circuit board (e.g., a daughterboard). A standoff typically has two ends to which the circuit boards are fastened. For example, one end of a standoff is securely fastened to a motherboard. Once fastened, a daughterboard is fastened to the other end (i.e., the end opposite the end to which the motherboard is fastened) of the standoff. Thus, standoffs function as a mechanical mating device that securely hold the motherboard a fixed distance apart from the daughterboard.

Many conventional standoffs use a screw to securely fasten the standoff to the motherboard. One major drawback with such conventional standoffs is that they are difficult and time consuming to fasten to the motherboard. The use of screws necessitates that the motherboard has a hole to receive the screw, and that there is access to the bottom of the motherboard in order to fasten the screw. It may not be convenient to provide access to the bottom of the motherboard to fasten the screw during the production process. Furthermore, the standoffs are typically fastened using a manual and labor-intensive process, which introduces additional cost and time to the motherboard manufacturing process.

What is desired is a standoff that can be easily and efficiently fastened to a circuit board without the use of a screw. What is also desired is a standoff that can be automatically fastened to the circuit board during the circuit board manufacturing process. Furthermore, a standoff suitable for being automatically fastened to a circuit board using machinery typically used in a conventional circuit board manufacturing process is also desired.

SUMMARY OF THE INVENTION

The present disclosure is directed to a standoff suitable for automated fastening to a circuit board and, a method for mechanically fastening the standoff to the circuit board, which substantially reduces or eliminates the disadvantages and problems associated with conventional methods of fastening standoffs as described above. One technical advantage of the present invention includes providing a standoff that is suitable for being quickly and efficiently attached to a circuit board during a conventional Surface Mount Technology (SMT) process. The standoffs of the present invention are suitable for handling by conventional SMT machinery. Another technical advantage of the present invention includes providing a process for automatically fastening the standoff to the circuit board utilizing a conventional SMT process. Utilizing SMT to fasten the standoff to the circuit board provides control, consistency, and quality not found in current manual processes, and thus, eliminates or reduces the expense and time associated with current manual processes. Still another technical advantage of the present invention includes providing a standoff that can be fastened to a circuit board without requiring access to both sides of the circuit board or requiring a hole in the circuit board.

In a first exemplary embodiment of the present invention a circuit board standoff is provided comprising a hollow substantially cylindrical member having an elongated middle section, a top section, and a bottom section. A flange extends from the bottom section to provide a substantially flat surface suitable for soldering onto a surface of a circuit board. Additionally, an opening operable to receive a fastener is positioned in the top section of the substantially cylindrical member.

In a second exemplary embodiment, a standoff as above-described is provided further comprising a tab extending from a section of the bottom surface of the flange suitable for insertion into an opening in the circuit board and operable to be soldered or folded to lie in a position substantially parallel to an underside of the circuit board. Additionally, such member's top section may have a substantially horizontal surface sufficient to receive a section of an underside of a second circuit board.

In a third exemplary embodiment of the present invention a circuit board standoff is provided comprising a hollow substantially cylindrical member having an elongated middle section, a top section, and a bottom section. A flange extends from the bottom section to provide a substantially flat surface suitable for soldering onto a surface of a circuit board. Additionally, an opening operable to receive a fastener is positioned in the top section of the substantially cylindrical member. In the present exemplary embodiment, the top section and a portion of the elongated middle section are suitable for insertion into an opening in a first circuit board. In the present embodiment, such standoff's bottom section may have either a substantially flat surface suitable for soldering onto the underside of a second circuit board or a plurality of tabs extending from a section of the bottom surface of the flange suitable for insertion into openings in a second circuit board and operable to be soldered thereto or folded to lie in a position substantially parallel to an upper surface of such second circuit board.

In a fourth exemplary embodiment, a standoff is provided comprising a hollow substantially cylindrical member having an elongated middle section, a top section, and a bottom section. A flange extends from the bottom section to provide a substantially flat surface suitable for soldering onto a surface of a circuit board. Such standoff further comprises a neck extending from the top section within said hollow substantially cylindrical member towards said bottom section and having a diameter smaller than that of the substantially cylindrical member. Further, such neck is threaded for receipt of a screw-like fastener. Such standoff suitable for any of the above-described means of physical attachment to at least a first circuit board.

In a fifth embodiment of the present invention a circuit board standoff is provided comprising a hollow substantially cylindrical member having an elongated middle section, a top section, and a bottom section. A flange extends from the bottom section to provide a substantially flat surface suitable for soldering onto a surface of a circuit board. Such standoff may be suitable for use with both grasping and vacuum nozzle-equipped SMT placement machines.

Additional objects and advantages of the invention are set forth in, or will be apparent to those of ordinary skill in the art from, the detailed description herein. Also, it should be further appreciated that modifications and variations to the specifically illustrated, referenced, and discussed steps, features, materials, or devices hereof may be practiced in various uses and embodiments of this invention without departing from the spirit and scope thereof, by virtue of present reference thereto. Such variations may include, but are not limited to, substitution of equivalent steps, materials, means, or features of those shown, referenced, or discussed, and the functional, operational, or positional reversal of various features, steps, parts, or the like.

Still further, it is to be understood that different embodiments, as well as different presently preferred embodiments, of this invention may include various combinations or configurations of presently disclosed steps, features, or elements, or their equivalents (including combinations of steps or features or configurations thereof not expressly shown in the figures or stated in the detailed description).

BRIEF DESCRIPTION OF THE DRAWINGS

A full and enabling disclosure of the present invention, including the best mode thereof, directed to one of ordinary skill in the art, is set forth in the specification, which makes reference to the appended figures, in which.

The elements of the drawings are not necessarily to scale, emphasis instead being placed upon clearly illustrating the principles of the invention. Repeat use of reference characters throughout the present specification and appended drawings is intended to represent the same or analogous features or elements of the invention.

DETAILED DESCRIPTION OF THE PREFERRED EMBODIMENTS

Reference will now be made in detail to presently preferred embodiments of the invention, examples of which are fully represented in the accompanying drawings. Such examples are provided by way of an explanation of the invention, not limitation thereof. In fact, it will be apparent to those skilled in the art that various modifications and variations can be made in the present invention, without departing from the spirit and scope thereof. For instance, features illustrated or described as part of one embodiment can be used on another embodiment to yield a still further embodiment. Still further, variations in selection of materials and/or characteristics may be practiced, to satisfy particular desired user criteria. Thus, it is intended that the present invention cover such modifications and variations as come within the scope of the present features and their equivalents.

Figure 1:
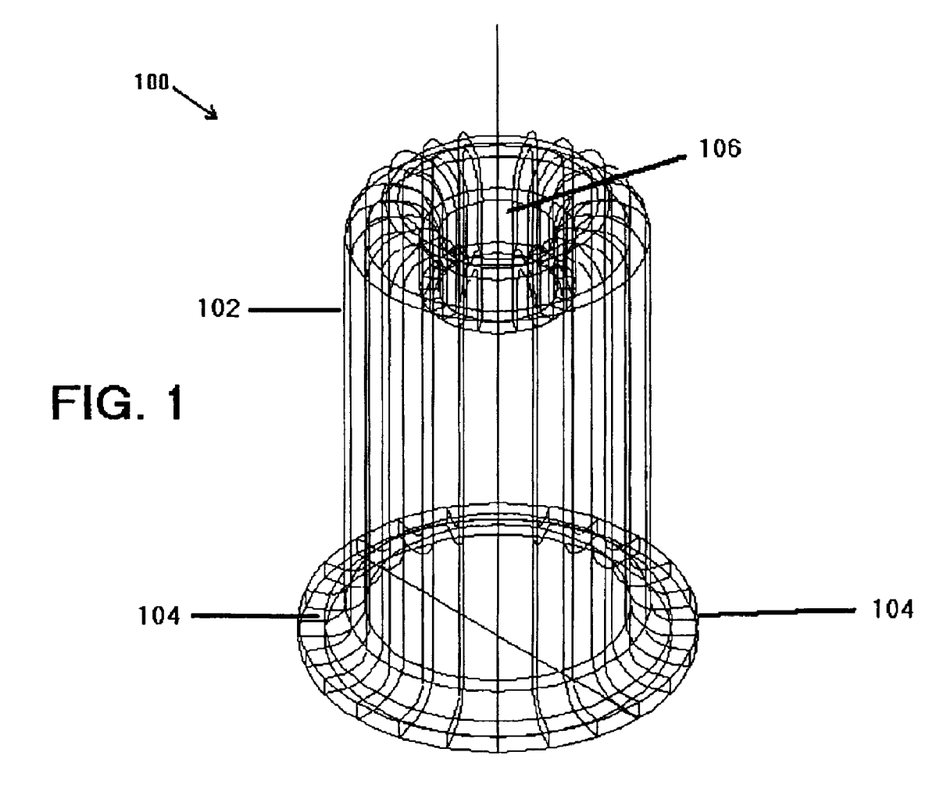
FIG. 1 illustrates a three-dimensional depiction of an exemplary standoff, according to one embodiment.

As disclosed above, the present invention is particularly concerned with a standoff suitable for automated fastening to at least one circuit board and, a method for mechanically fastening such standoff to said at least one circuit board. FIG. 1 exemplifies an embodiment of the present invention wherein a circuit board standoff 100 is providing comprising a hollow substantially cylindrical member 102 having an elongated middle section, a top section, and a bottom section. A flange 104 extends from the bottom section to provide a substantially flat surface suitable for soldering onto a surface of a circuit board. Such flange 104 need not be circular as shown. Alternatively, such flange 104 may have a variety of shapes including opposing flat edges along the periphery of the major diameter of the flange (not shown) thus aiding SMT machinery to properly orient the standoff on the circuit board. Additionally, an opening 106 operable to receive a fastener is positioned in the top section of the substantially cylindrical member 100.

Figure 2:
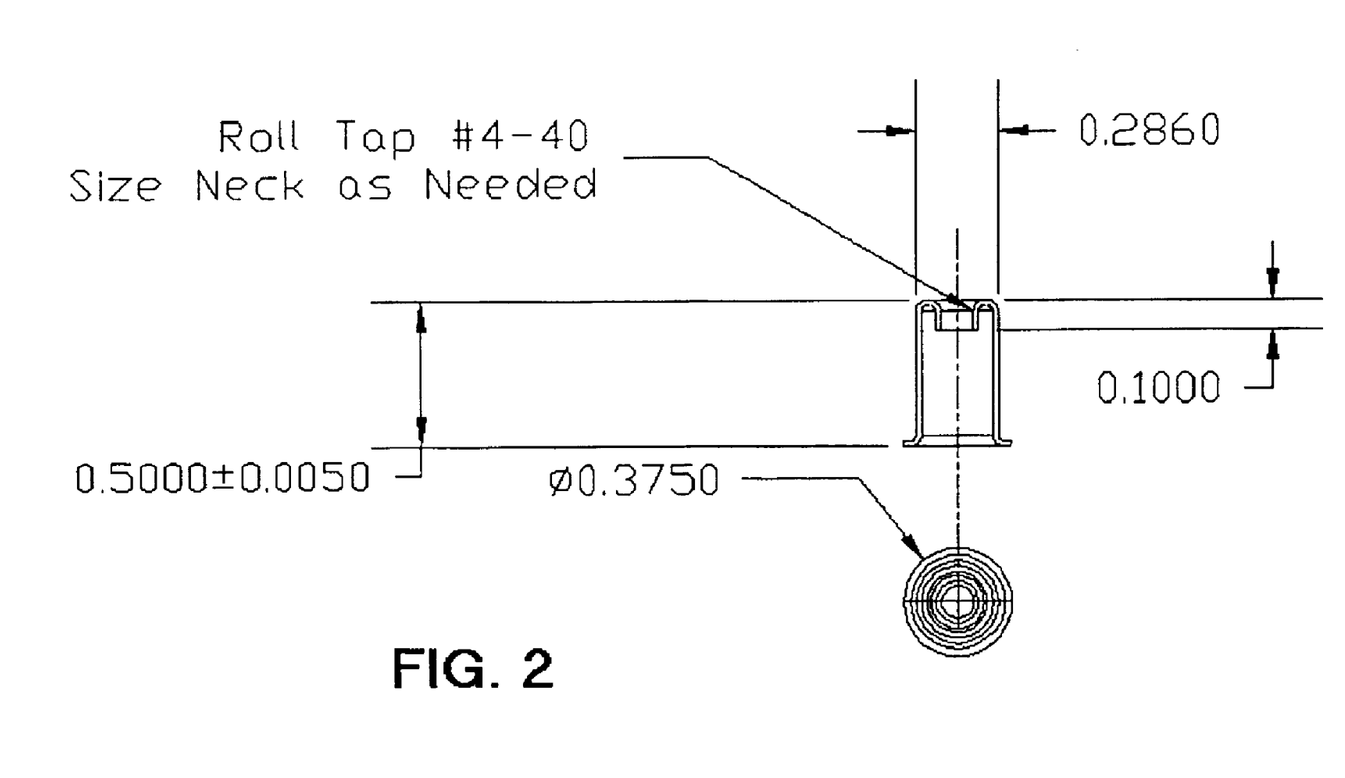
FIG. 2 illustrates schematic views of an exemplary standoff, according to another embodiment.

FIG. 2 provides a schematic diagram of an exemplary standoff 100 in accordance with one embodiment of the present invention. As shown the standoff 100 may further comprise a neck extending from the top section of the substantially cylindrical member 102 and having a diameter smaller than that of the substantially cylindrical member 102. Such neck may have the opening for the receipt of a fastener. In the present exemplary embodiment such neck extends one-tenth (0.10) of an inch below the top section within the substantially cylindrical member 102. Further, the opening within said neck is sized specifically for a #4 screw with forty (40) threads per inch. It should be noted that the size of such a standoff 100 may vary in all its dimensions as directed by the environment of its use. As such, any dimension specified herein should be considered exemplary only and forms no particular aspect of the present invention.

Figure 3A:
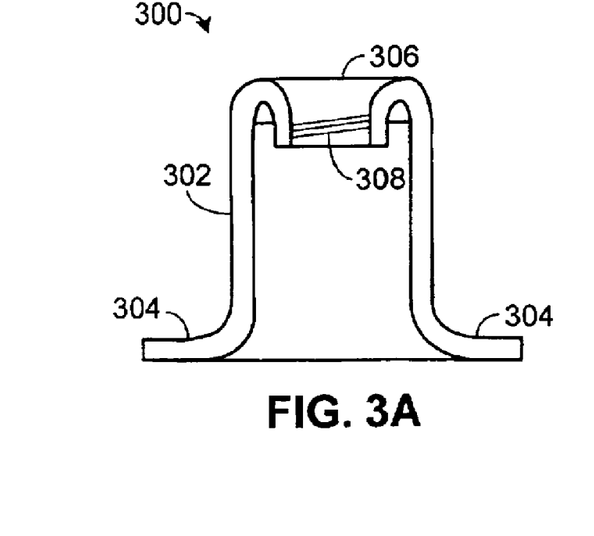
FIGS. 3A–3E illustrate schematic views of various embodiments of an exemplary standoff.

FIGS. 3A–3E illustrate various alternative embodiments of the present invention capable of varied methods of attachment to a first and a second circuit board while maintaining the ability to work with existing SMT placement machinery. In particular, FIG. 3A illustrates a first exemplary embodiment in which a circuit board standoff 300 is provided comprising a hollow substantially cylindrical member 302 having an elongated middle section, a top section, and a bottom section. A flange 304 extends from the bottom section to provide a substantially flat surface suitable for soldering onto a surface of a circuit board. Additionally, an opening 306 operable to receive a fastener is positioned in the top section of the substantially cylindrical member 302. Such standoff 300 further comprises a neck 308 extending from the top section of and within the substantially cylindrical member 302 and having a diameter smaller than that of the substantially cylindrical member 302. Such neck 308 has the opening 306 for the receipt of a fastener and such opening 306 is threaded.

Figure 3B:
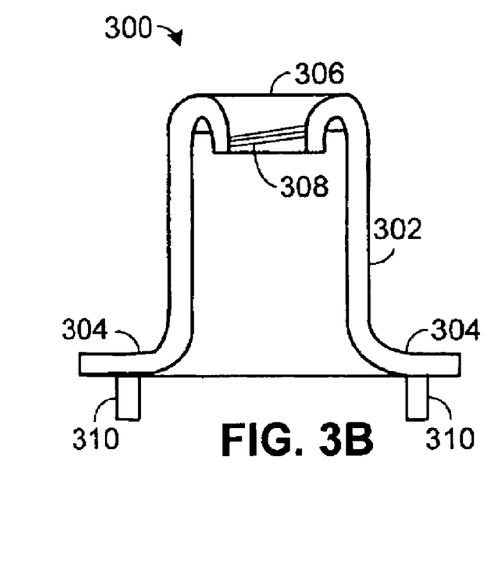

In a second alternative exemplary embodiment, a standoff 300, as shown in FIG. 3B, is provided comprising a hollow substantially cylindrical member 302 having an elongated middle section, a top section, and a bottom section. A flange 304 extends from the bottom section to provide a substantially flat surface suitable for soldering onto a surface of a circuit board. Additionally, an opening 306 operable to receive a fastener is positioned in the top section of the substantially cylindrical member 302.

Further, such standoff 300 comprises at least one tab 310 extending from a section of the bottom surface of the flange 304 suitable for insertion into a corresponding plated through hole in the circuit board. Still further, such standoff 300 comprises a neck 308 extending from the top section of the substantially cylindrical member 302 and having a diameter smaller than that of the substantially cylindrical member 302. Such neck 308 has the opening 306 for the receipt of a fastener and such opening 306 is threaded. The at least one tab 310 is operable to be soldered to an underside of a circuit board or to be folded to lie in a position substantially parallel to an underside of such circuit board.

Figure 3C:
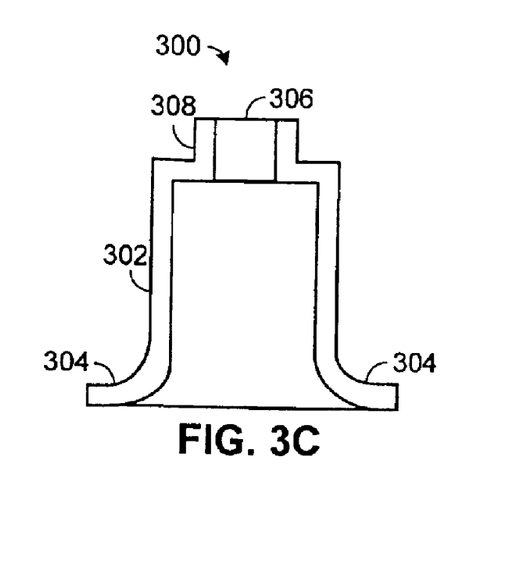

FIG. 3C illustrates a third alternative exemplary embodiment of a standoff 300 in accordance with the present invention in which the neck 308 extends from said opening 306 outside the substantially cylindrical member 302. As with the inward extending neck 308, such outwardly extending neck may be alternatively suited for receipt of a screw-type fastener or a rivet.

In all of the embodiments illustrated herein, there are similar characteristics which define various capabilities of the present invention. For example, in all of the alternatively exemplary embodiments, the elongated middle section of the substantially cylindrical member 302 is suitable for grasping by a SMT placement machine. Similarly, the top section of the substantially cylindrical member 302 has a substantially horizontal surface sufficient to receive a section of an underside of a second circuit board. Further, the standoff 300 may be made of any suitable material, but it is preferably metal and most preferably a cold rolled steel. Still further, the standoff 300 may be suitable for manufacture by stamping it via a drawn eyelet process.

Figure 3D:
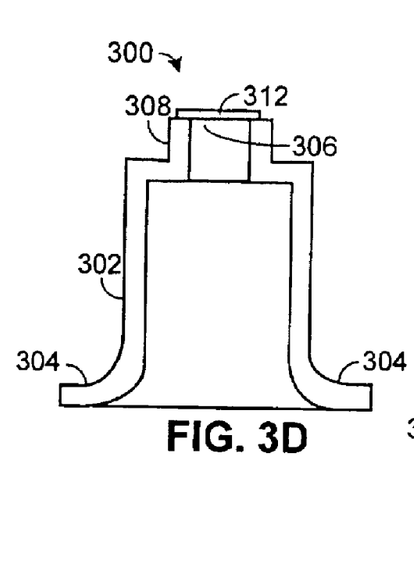

Alternatively, a user may desire to use the present invention with a vacuum-nozzle equipped SMT placement machine. As the standoff 300 is a hollow generally cylindrical apparatus, there exists a need for temporarily sealing the opening 306 to allow the vacuum nozzle to lift, orient and place the standoff as desired. FIG. 3D illustrates a solution to such problem wherein a high temperature adhesive tape 312 has been temporarily affixed over the opening 306. The embodiment of FIG. 3C is illustrated utilizing the high temperature adhesive tape 312, however, such tape 312 could also be utilized with any of the presently illustrated embodiments wherein the neck 308 extends within the substantially cylindrical member 302 because of the substantially horizontal surface of the top section.

Figure 3E:
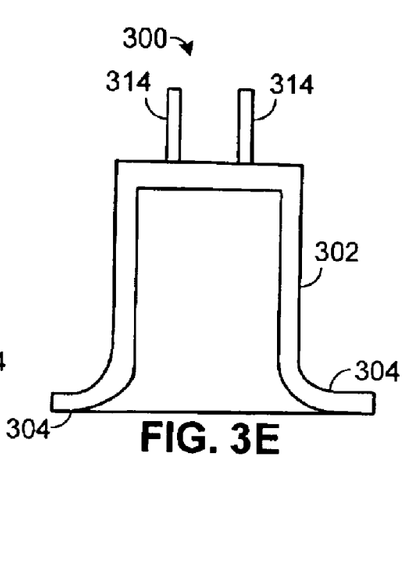
Figure 8:
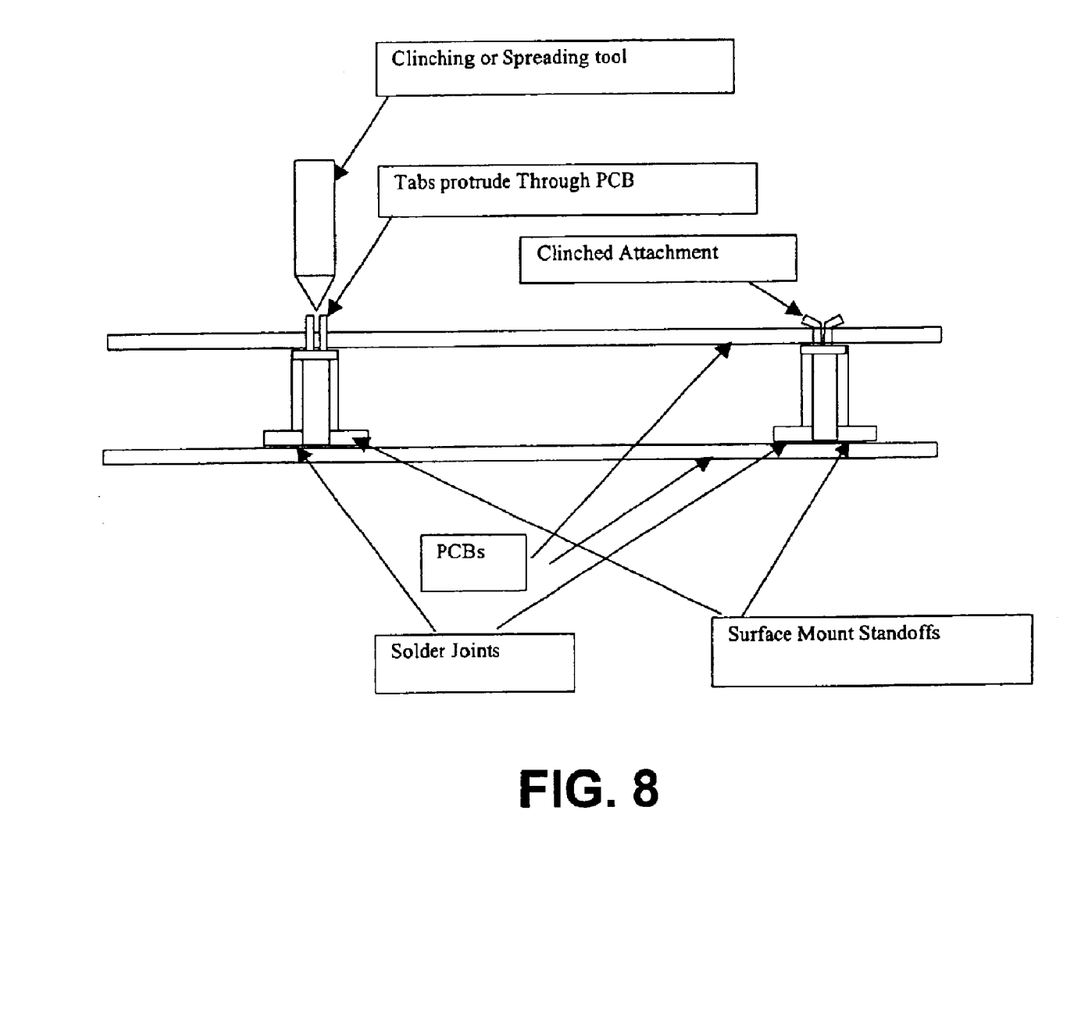
FIG. 8 illustrates a schematic view of an exemplary standoff mating two circuit boards, according to another embodiment.

Finally, FIG. 3E illustrates an alternative method of attachment of the standoff 300 to a second circuit board, in which a circuit board standoff 300 is provided comprising a hollow substantially cylindrical member 302 having an elongated middle section, a top section, and a bottom section. A flange 304 extends from the bottom section to provide a substantially flat surface suitable for soldering onto a surface of a first circuit board. Tabs 314 extend away from the substantially horizontal surface of the top section of the substantially cylindrical member 302. Such tabs 314 may be suited for insertion through a corresponding plated through hole in a second circuit board as seen in FIG. 8. The tabs 314 are suitable to then be spread apart to lie substantially parallel to an upper surface of the second circuit board thereby securely connecting the first and second circuit boards together.

Figure 4:
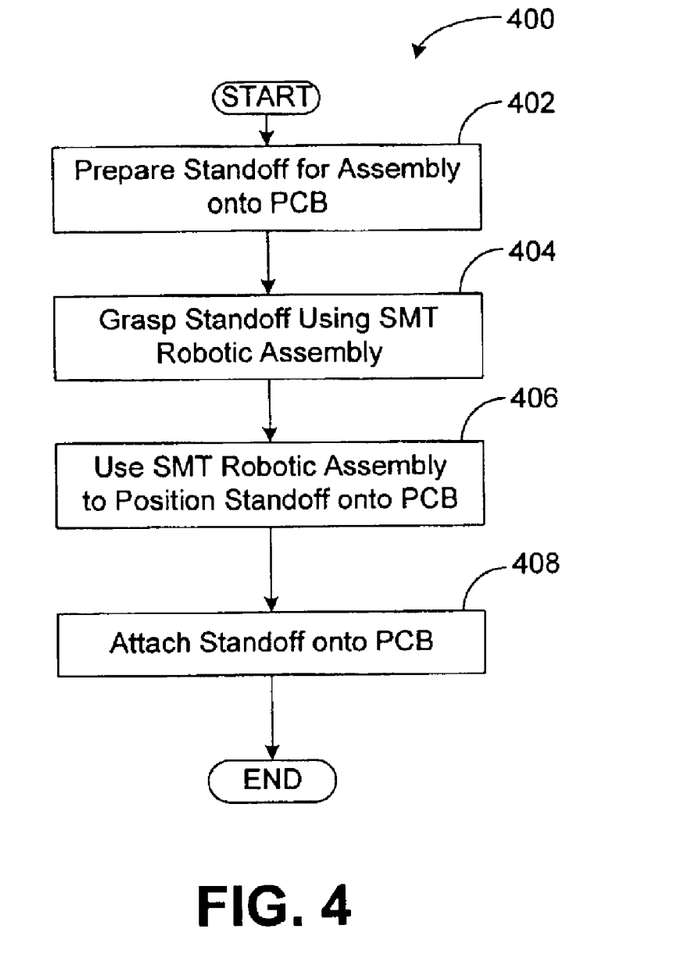
FIG. 4 is a flow chart of an exemplary method of fastening a standoff to a circuit board using SMT, according to one embodiment.

FIG. 4 illustrates a flowchart of an exemplary method 400 of attaching a standoff to a first printed circuit board using SMT. Initially, each of the component parts of the printed circuit board assembly must be prepared for attachment to each other. The circuit board must first be prepared for the attachment of the standoff by silk-screening the printed circuit board with solder paste thus providing a pattern of attachment points (a.k.a. pads) adequate to ensure sufficient contact surface for the placement of the standoff 100/300. In the exemplary embodiments including a flange 304 with tabs 310, such circuit board preparation may include the silk-screening of both the upper and lower surfaces of the printed circuit board in order to provide the necessary solder paste to secure such flanges after their insertion into plated through holes in the circuit board.

The standoff 100/300 may be prepared 402 by tinning a portion of its flange 304 with a material suitable for ensuring a secure mechanical bond to the circuit board. Such material may include copper, gold, lead, silver, as well as tin and its alloys, particularly tin/lead. Such tinning may be achieved by either hot-dipping the flange 304 of the standoff in solder or by electroplating a thin layer of the chosen tinning material onto the flange 304. Such hot-dipping or electroplating of the flanges 304 serves to provide a clean, oxidation-free metal surface which will provide a superior mechanical bond to the printed circuit board.

Figure 5:
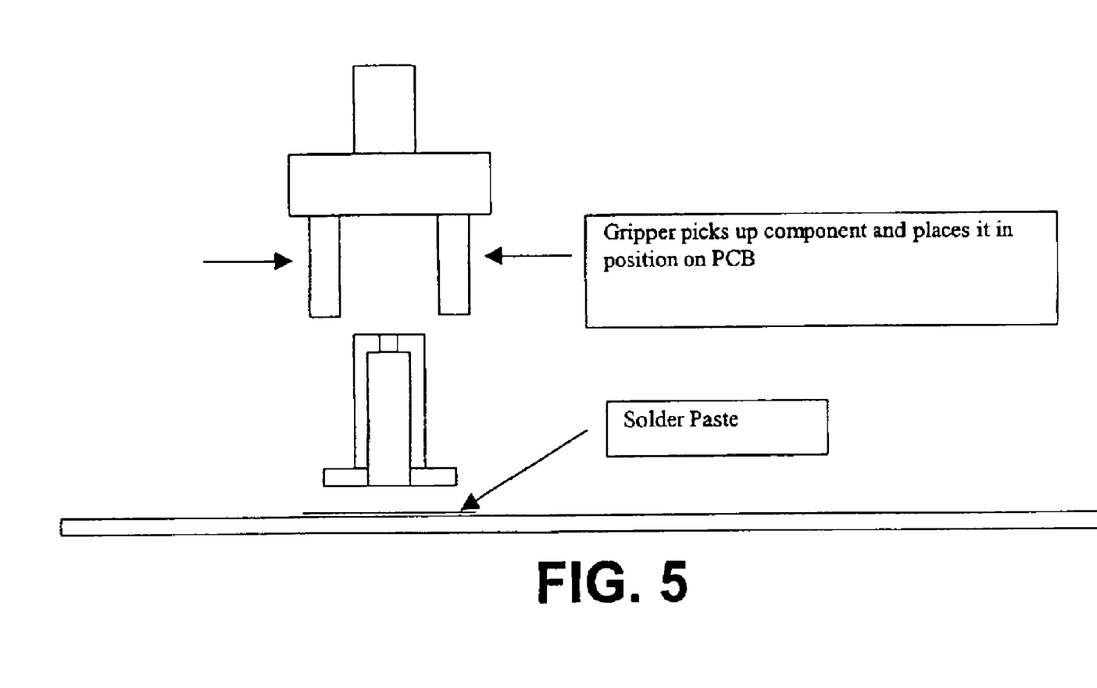
FIG. 5 illustrates a schematic view of an exemplary SMT robotic assembly orienting an exemplary standoff for placement onto a circuit board.

The next steps 404 and 406 in the present exemplary method 400 are grasping, moving and orienting the standoff utilizing a SMT robotic assembly. All of the presently preferred exemplary embodiments are capable of operating with known grasping or vacuum SMT placement machines. As described above, the use of vacuum SMT placement machines requires the use of high temperature adhesive tape 312 over the opening 306 of the standoff 100/300. Each of such embodiments has sufficient structural rigidity to be grasped about the substantially cylindrical member's middle section as depicted in FIG. 5.

Such SMT placement machines are capable of extremely precise placement of electronic components at locations anywhere on the circuit board. In the present case, the SMT robotic assemblies insure proper alignment of the flange 304 with its respective solder pad(s). Where the flange 304 has tabs 310, the SMT placement machines also insure the passage of the tabs 310 into the plated through holes provided in the printed circuit board.

Finally, the circuit board assembly (CBA), the circuit board with all its assorted electronic components and the standoff, are processed 408 to complete the mechanical coupling between the parts. The design of the present invention allows for the processing 408 of the CBA either by re-flow soldering or wave soldering of the standoff to the circuit board. In re-flow soldering, the circuit board with all of its components is heated in an oven to produce fusion of the solder in the solder paste, which forms a mechanical bond between the components and the board when cooled, including the standoff. Alternatively, a wave soldering process may be used in which the board is passed over a bath of molten solder.

Figure 6:
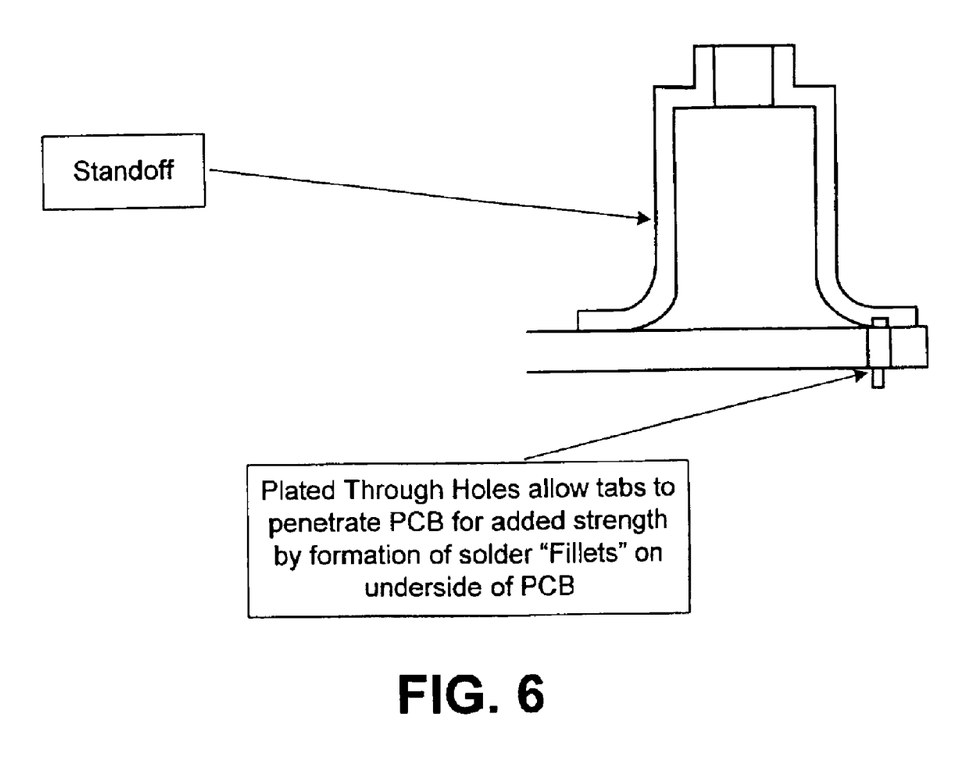
FIG. 6 illustrates a schematic view of an exemplary standoff fastened to a circuit board, according to one embodiment.

FIG. 6 illustrates exemplary solder joints at the points of connection between one exemplary embodiment of the present invention and a first circuit board. To enhance the mechanical strength of the bond between the stiffener and the circuit board, the formation of fillets in the solder joints is encouraged. In particular, wave soldering the joints allows for the wicking of the melted solder paste into the plated through holes in the circuit board, as well as filling in the right angle interactions between the circuit board and the tabs on the underside of the circuit board. The additional material at these right angle interactions typically form in smoothly-radiused curves known as fillets which aid in enhancing the mechanical strength of the bond between the circuit board and the present invention.

Figure 7:
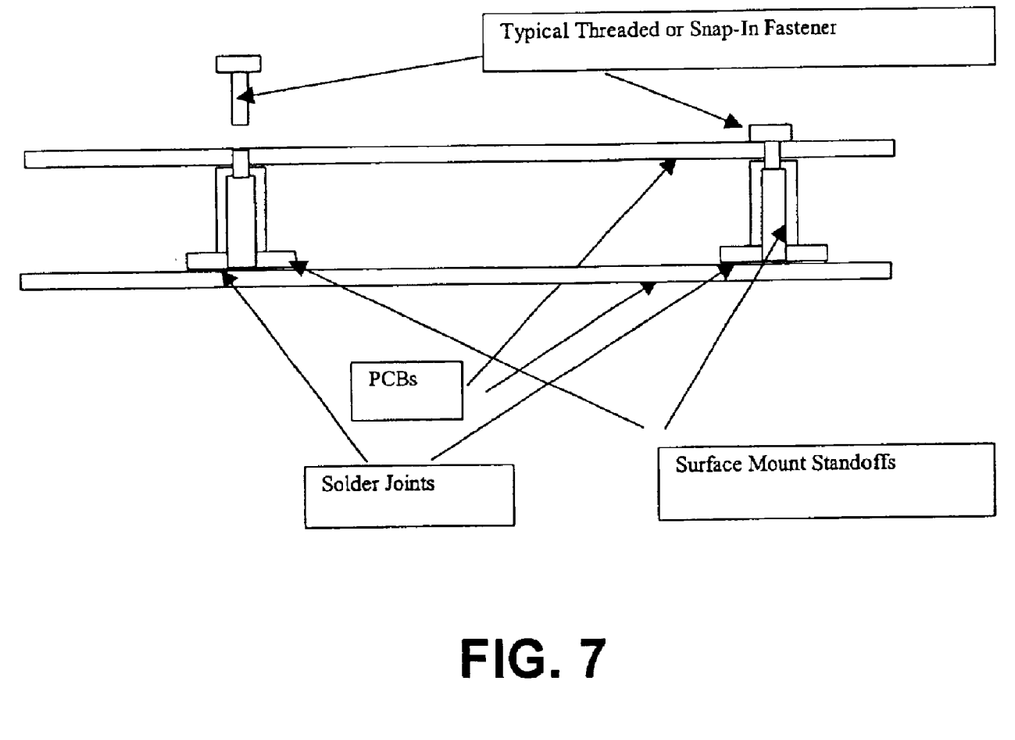
FIG. 7 illustrates a schematic view of an exemplary standoff mating two circuit boards, according to one embodiment.

FIGS. 7 and 8 illustrate two alternative methods of physically attaching a second circuit board to a first circuit board using the standoff 100/300. In FIG. 7, an exemplary standoff 100/300 as depicted in FIG. 3C is shown already soldered to a first circuit board. A second circuit board, resting on the substantially horizontal surface of the top section of the substantially cylindrical member 302 can be seen awaiting final coupling to the standoffs 100/300. In the illustrated example the fasteners connecting the second circuit board and the standoffs may be either the typical threaded or snap-fit fasteners such as a rivet or screw.

FIG. 8 illustrates an alternative method of attaching a second circuit board to a first via the present invention. An exemplary standoff 100/300 as depicted in FIG. 3E, comprising tabs 314 extending out from the top section of the substantially cylindrical member 302 for insertion in a corresponding plated through hole in the second circuit board is shown already soldered to a first circuit board. As in FIG. 7, a second circuit board rests on the substantially horizontal surface of the top section of the substantially cylindrical member 302 awaiting final coupling to the standoffs 100/300. In the present method, clinching/spreading tool is utilized to splay the tabs 314 so they lay substantially parallel to an upper surface of the second circuit board. The clinching/spreading tool then ensures a firm physical seating of the splayed tabs 314 against the second circuit board. Alternatively, such tabs 314 could be soldered to the upper surface of the second circuit board.

Although a preferred embodiment of the invention has been described using specific terms and devices, such description is for illustrative purposes only. The words used are words of description rather than of limitation. It is to be understood that changes and variations may be made by those of ordinary skill in the art without departing from the spirit or the scope of the present invention, which is set forth in the following claims. In addition, it should be understood that aspects of various other embodiments may be interchanged both in whole or in part. Therefore, the spirit and scope of the appended claims should not be limited to the description of the preferred version contained herein.

What is claimed is:

1. A circuit board standoff comprising:
    a hollow substantially cylindrical member having an elongated middle section, a top section, and a bottom section;
    a flange extending from the bottom section to provide a substantially flat bottom surface suitable for soldering onto a surface of a circuit board;
    an opening positioned in the top section of the substantially cylindrical member and operable to receive a fastener; and
    a tab extending from a section of the bottom surface of the flange, the tab suitable for insertion into an opening in the circuit board.

2. The standoff of claim 1, wherein the tab is operable to be soldered to an underside of the circuit board.

3. The standoff of claim 1, wherein the tab is operable to be folded to lie in a position substantially parallel to an underside of the circuit board.

4. The standoff of claim 1, wherein the substantially flat bottom surface of the flange includes an area that has been tinned.

5. The standoff of claim 4, wherein the substantially flat bottom surface of the flange includes an area that has been tinned with a layer of tin.

6. The standoff of claim 4, wherein the substantially flat bottom surface of the flange includes an area that has been tinned with a layer of tin/lead alloy.

7. The standoff of claim 4, wherein the substantially flat bottom surface of the flange includes an area that has been tinned with a layer of solder.

8. The standoff of claim 1, wherein the elongated middle section is suitable for grasping by a SMT placement machine.

9. The standoff of claim 1 further comprising a high temperature adhesive tape affixed to the opening in the top section of the substantially cylindrical member, thus enabling the standoff to be grasped by a vacuum nozzle affixed to a SMT placement machine.

10. The standoff of claim 1 further comprising a neck extending from the top section, the neck having a diameter smaller than a diameter of the substantially cylindrical member, the neck having the opening to receive a fastener.

11. The standoff of claim 10, wherein an inside surface of the neck is threaded to receive a screw-like fastener.

12. The standoff of claim 10, wherein the neck protrudes inside the hollow substantially cylindrical member.

13. The standoff of claim 1 further comprising a tab extending from the top section, the tab suitable for insertion into a hole in a second circuit board, the tab operable to be folded to fasten the second circuit board.

14. The standoff of claim 1, wherein the top section has a substantially horizontal surface sufficient to receive a section of an underside of a second circuit board.

15. The standoff of claim 1, wherein the standoff is made from cold rolled steel.

16. The standoff of claim 1, wherein the standoff is suitable for manufacture via a stamping process.

17. The standoff of claim 1, wherein the fastener is a rivet.

18. The standoff of claim 1, wherein the fastener is a screw.

* * * * *